United States Patent [19]
Kimata

[11] Patent Number: 5,095,211
[45] Date of Patent: Mar. 10, 1992

[54] INFRARED IMAGE SENSOR AND IMAGE PICK-UP APPARATUS USING THE SAME

[75] Inventor: Masafumi Kimata, Hyogo, Japan

[73] Assignee: Mitsubishi Denki Kabushiki Kaisha, Tokyo, Japan

[21] Appl. No.: 636,850

[22] Filed: Jan. 2, 1991

[30] Foreign Application Priority Data

Jan. 11, 1990 [JP] Japan .................................. 2-4746

[51] Int. Cl.$^5$ ............................................. H01L 27/14
[52] U.S. Cl. ........................ 250/370.08; 250/370.14; 250/332; 250/352; 357/30
[58] Field of Search ............... 250/332, 370.14, 370.08, 250/338.4, 352; 357/30 L, 30 C, 30 D

[56] References Cited

U.S. PATENT DOCUMENTS

| | | | |
|---|---|---|---|
| 3,963,926 | 6/1976 | Borello | 250/338 |
| 4,446,372 | 5/1984 | Gurnee | 250/334 |
| 4,876,586 | 10/1989 | Dyck et al. | 357/30 C |

FOREIGN PATENT DOCUMENTS

| | | | |
|---|---|---|---|
| 0305257 | of 1989 | European Pat. Off. | |
| 60-130870 | of 1985 | Japan . | |
| 0012154 | 1/1987 | Japan | 357/30 L |
| 63-43366 | 2/1988 | Japan . | |
| 2143676 | 2/1985 | United Kingdom | 357/30 L |

OTHER PUBLICATIONS

Winstel et al., "Optoelektronik II", 1986, pp. 230-233.
Freeman D. Shepherd, Jr., entitled "Schottky Diode Based Infrared Sensors", Proceedings of the SPIE (1983), vol. 443.
F. F. Martin, entitled "An Antitank Missile Seeker Employing an Infrared Schottky Barrier Focal Plane Array", SPIE, vol. 302, Infrared Technology for Target Detection and Classification (1981).
Kimata et al., entitlted "O plus E No. 115", Jun. 1989, pp. 100-104.
"Transistor Material Engineering", pp. 288-291, Asakura Electrical Engineering Lecture 10, published by Asakura Bookstore, Oct. 1989.

Primary Examiner—Carolyn E. Fields
Assistant Examiner—James E. Beyer
Attorney, Agent, or Firm—Lowe, Price, LeBlanc & Becker

[57] ABSTRACT

An infrared image sensor includes a plurality of Schottky type infrared detecting elements (8) arranged in array formed on one main surface of a semiconductor substrate (1a) or in a vicinity of the one main surface to allow incident infrared rays from the other main surface of the semiconductor substrate (1a). In this infrared image sensor (1), a high concentration impurity layer (12) is provided between one main surface and the other main surface of the semiconductor substrate (1a), which layer being provided with an infrared ray transparent aperture for the corresponding predetermined unit of the grouped infrared detecting elements (8). According to the infrared image sensor (1), by making the aperture of the high concentration impurity layer (12) into a predetermined configuration at a predetermined position determined by the positional relation between an optical system irradiated by the infrared rays and each detecting element, it is possible to allow only the infrared rays in the desired field to irradiate each infrared detecting element (8) and prevent undesired incident light, thereby improving the efficiency in removing the undesired light and reducing noise.

12 Claims, 7 Drawing Sheets

METAL | P TYPE SEMICONDUCTOR

METAL | P TYPE SEMICONDUCTOR

INFRARED IMAGE SENSOR AND IMAGE PICK-UP APPARATUS USING THE SAME

BACKGROUND OF THE INVENTION

1. Field of the Invention

The present invention relates generally to infrared image sensors for detecting infrared rays radiated by objects to take distributions of temperatures and emissivity of the objects as image and, more particularly, to a Schottky type infrared image sensor having improved efficiency in removing undesired light.

2. Description of the Background Art

Image pick-up by using an infrared image sensor is widely applied to various industrial measurements and monitoring and in a field of research and development. A conventional infrared image pick-up apparatus is a mechanical scanning type using a single element or one dimensional small-sized arrays. In recent years there has been rapid progress in the semiconductor technology, enabling two dimensional arrays of practical level to be obtained.

Conventional examples of Schottky type infrared image sensors having arrangements including so-called cold shield are shown in FIG. 4 on page 48 of "Proceedings of the SPIE (1983), Vol. 443, Infrared Detectors" and in FIG. 10 on page 165 of "SPIE Vol. 302 Infrared Technology for Target Detection and Classification (1981)".

FIG. 1 is a sectional view of an infrared image pickup apparatus mounting an infrared image sensor 1 of approximately the same type as that of the above-described conventional infrared image sensor. This infrared image sensor 1 has integrated infrared detecting elements disposed one- or two-dimensionally and as shown in the drawing, the sensor is disposed in an internal portion 2a of a vacuumed dewar 2. A cold shield 3 is disposed in the internal portion 2a of the dewar 2 to cover the peripheral portion above the infrared image sensor 1. This cold shield 3 is provided to ensure a fixed field of view with respect to incident infrared rays from a window 4 at the upper portion of the dewar 2 of the infrared image sensor and to prevent undesired incident light from the outside of the dewar 2 by cutting off thermal radiation from a body tube in an optical system or the like. Attached to lower ends of left and right leg portions 5a and 5b of the dewar 2 are lead-through electrodes 6a and 6b for externally extracting a clock power supply or signal output for driving the infrared image sensor 1.

A cavity portion 7 between the left and right leg portions 5a and 5b of the dewar 2 is filled with liquid nitrogen or the like for cooling the infrared image sensor 1. The infrared image sensor 1 is adhered to the internal surface of the dewar 2 and cooled by heat conduction through the dewar 2.

As indicated by the arrow A of FIG. 1, the infrared rays enter the infrared image sensor 1 through the window 4. However, the incident infrared rays on the image sensor 1 are not limited thereto but they are radiated from every portion constituting the image pick-up apparatus, among which a higher temperature portion radiates more. Such undesired incident light from other fields of view than the regular field on the infrared image sensor 1 increases noise and reduces a dynamic range. Provided for cutting off the undesired incident light is the cold shield 3. The cold shield 3 is set to be maintained at a temperature as low as that of the infrared image sensor 1 and to have a high internal emissivity and a lower external emissivity. The aperture of the cold shield 3 is configured as shown in FIG. 2. More specifically, assuming that $B_1$ and $B_2$ shown in FIG. 2 denote left and right end positions of an aperture stop for stopping down the incident infrared rays on the infrared image sensor 1, the solid angles $\theta a$ and $\theta c$ for the detecting elements 8 nearest to edges are smallest among $\theta a, \theta b$ and $\theta c$ at which the detecting elements 8 provided on the lower main surface of the infrared image sensor 1 looking up at $B_1$ and $B_2$. Therefore, the aperture configuration of the cold shield 3 is settled such that the solid angles $\theta a$ and $\theta c$ become larger than the solid angle $\theta y$ of one detecting element required in optical designing of the image pick-up apparatus.

While three detecting elements 8 are provided for the sake of explanation in FIG. 2, numbers of miniaturized detecting elements are actually provided two-dimensionally.

As conventional art to resolve the above-described problem of the conventional example, proposed is Japanese Patent Laying-Open No. 63-43366 is the arrangement of the back-illuminated infrared ray sensor provided with infrared ray absorbing layers disposed selectively, wherein crystal of mercury.cadmium.tellurium of a first conductivity type is formed on a surface of a cadmium.tellurium substrate, on the surface of which formed at a predetermined interval are a plurality of regions of a conductivity type opposite to the first conductivity type and infrared ray absorbing layers are selectively provided between the cadmium.tellurium substrate and the crystal of mercury.cadmium.tellurium. For the infrared ray absorbing layer, a mercury.cadmium.tellurium layer of a thickness of about 1 $\mu$m is used.

However, in the above-described arrangement of the conventional image pick-up apparatus, as the detecting elements increase in number, a chip size of the infrared image sensor 1 increases. Therefore, the aperture diameter of the cold shield 3 needs to be made larger in order to ensure enough solid angle in each detecting element in the peripheral portion thereof. As a result, the shield effect of the cold shield 3 is reduced to cause an increase in noise sensed by the sensing elements and saturation. More specifically, as shown in FIG. 3A, in the optical system of the above-described conventional arrangement, since for example, the solid angle of the incident rays onto the detecting element 8 at the center of the infrared image sensor 1 through a lens 10 of an apparatus stop 9 is smaller than the solid angle at which the aperture of the cold shield 3 is looked up at from the detecting element, the incident infrared rays in the hatched part of the drawing become interference light 11 for the detecting element. As the foregoing, the optical system is referred to as a non-matching optical system, the system wherein the regions at which the incident infrared rays pass through the aperture surface of the cold shield 3 vary depending on the positions of the detecting elements of the infrared image sensor 1.

A so-called aperture-matching optical system can be applied to resolve the problem of the above-described conventional non-matching optical system. FIGS. 3B to 3D show examples of arrangements of the aperture-matching optical system. The aperture portion of the cold shield 3 is an aperture stop of the optical system in each arrangement. Since the aperture stop determines the extent of the signal rays passing through the optical system, the body tube can not be seen from each detecting element through the aperture of the cold shield 3. Namely, the undesired infrared rays irradiated from the body tube can be cut off by the cold shield 3. Out of these aperture-matching optical systems, the arrangement shown in FIG. 3B is an example wherein the aperture stop 9 of the conventional optical system is replaced by the cold shield 3, with the lens 10 provided at the aperture portion of the cold shield 3. In the optical system of this type, the lens 10 is included in the cold shield 3 to increase heat load of the cooling means.

The optical system shown in FIG. 3C is the example wherein the aperture portion of the cold shield 3 is arranged at the light emission side of the lens 10. With this arrangement, while optical designing is restricted, there is no such problem of cooling as in the arrangement of FIG. 3B. However, in the optical system of this type, a region of the lens through which the incident rays pass varies so largely depending on the solid angles that effective diameter of the lens becomes large.

The optical system shown in FIG. 3D is the example of the arrangement comprising an objective lens 10a and a relay lens 10b. The relay lens 10b forms on the infrared image sensor 1 the target image formed by the objective lens and forms the image (exit pupil) of the aperture stop 9 of the objective lens 10a on the aperture surface of the cold shield 3. The aperture of the cold shield 3 is set to be smaller than the exit pupil such that the aperture stop of the objective lens can not be seen from the detecting elements. In the optical system of this type, the diameter can be small but the total length is large.

With the infrared ray sensor disclosed in Japanese Patent Laying-Open No. 63-43366, it is difficult to form infrared image sensors of a monolithic arrangement on the same substrate, so that detecting elements and reading circuits are separately manufactured and put one upon another to have a hybrid structure. Therefore, the increased number of pixels makes the manufacture thereof difficult.

SUMMARY OF THE INVENTION

One object of the present invention is to provide an infrared image sensor and an image pick-up apparatus using the same capable of preventing undesired incident interference light and allowing a monolithic arrangement to be easily implemented without the necessity of increasing the strength and complexity of the optical system components.

The infrared image sensor according to the present invention includes a plurality of Schottky type infrared detecting elements arranged in array formed on or near one main surface of a semiconductor substrate thereof to allow incident infrared rays from the other main surface of the semiconductor substrate. Provided in this infrared image sensor is a high concentration impurity layer provided with infrared ray transparent apertures formed at predetermined positions between one main surface and the other main surface of the semiconductor substrate corresponding to grouped detecting elements per predetermined unit.

According to the present invention, it is possible to allow only the infrared rays in the desired field to illuminate the respective detecting elements to prevent undesired incident interference light, by forming the apertures of the high concentration impurity layer into a predetermined configuration at predetermined positions determined by the relation between the positions of the optical system illuminated by the infrared rays and the respective detecting elements. As a result, the efficiency in removing undesired light can be improved and the noise can be reduced.

The concentration of the high concentration impurity layer constituting the infrared image sensor according to the present invention is preferably in the range of $10^{18}$–$10^{19}/cm^3$, because below $10^{18}/cm^3$, the sufficient infrared ray absorbing effect can not be obtained and above $10^{19}/cm^3$, the impurity layer extends near the periphery of the aperture portion to reduce the aperture area, thereby deteriorating the sensitivity in detecting infrared rays.

The high concentration impurity layer constituting the infrared image sensor according to the present invention is formed in the semiconductor substrate or near the main surface thereof according to the circumstances. The layer is formed in the semiconductor substrate by a light energy ion implanting method. It is formed near the main surface of the semiconductor substrate not only by an aperture energy ion implanting method but also by an epitaxial growth method.

The Schottky type infrared detecting element constituting the infrared image sensor according to the present invention preferably includes a metal electrode formed of a metal silicide layer on a p type semiconductor substrate. The metal electrode formed of the metal silicide layer is formed by solid phase reaction to be highly uniform, thereby obtaining an infrared detecting element having excellent uniformity of sensitivity, which is an important characteristic for a two dimensional array.

The aperture of the high concentration impurity layer may be provided not only corresponding to an infrared detecting element per pixel but also for every group of a predetermined number of infrared detecting elements. For example, a plurality of infrared detecting elements are grouped on a predetermined number basis forming a column and the respective columns of the groups and vertical CCDs for reading signals are alternately arranged, which are connected to horizontal CCDs and output amplifiers, to be effectively applied to an interline transfer system.

The infrared image pick-up apparatus using the infrared image sensor according to the present invention includes the above-described infrared image sensor according to the present invention and a dewar containing the infrared image sensor in the vacuumed internal portion thereof to allow the infrared rays to illuminate the infrared image sensor. A further application of a cold shield in addition to this arrangement further ensures the prevention of undesired interference light.

The foregoing and other objects, features, aspects and advantages of the present invention will become more apparent from the following detailed description of the present invention when taken in conjunction with the accompanying drawings

BRIEF DESCRIPTION OF THE DRAWINGS

FIG. 1. is a sectional view showing the example of the high concentration impurity layer 12 formed near the main surface of the infrared image sensor.

DESCRIPTION OF THE PREFERRED EMBODIMENTS

Figure 4:
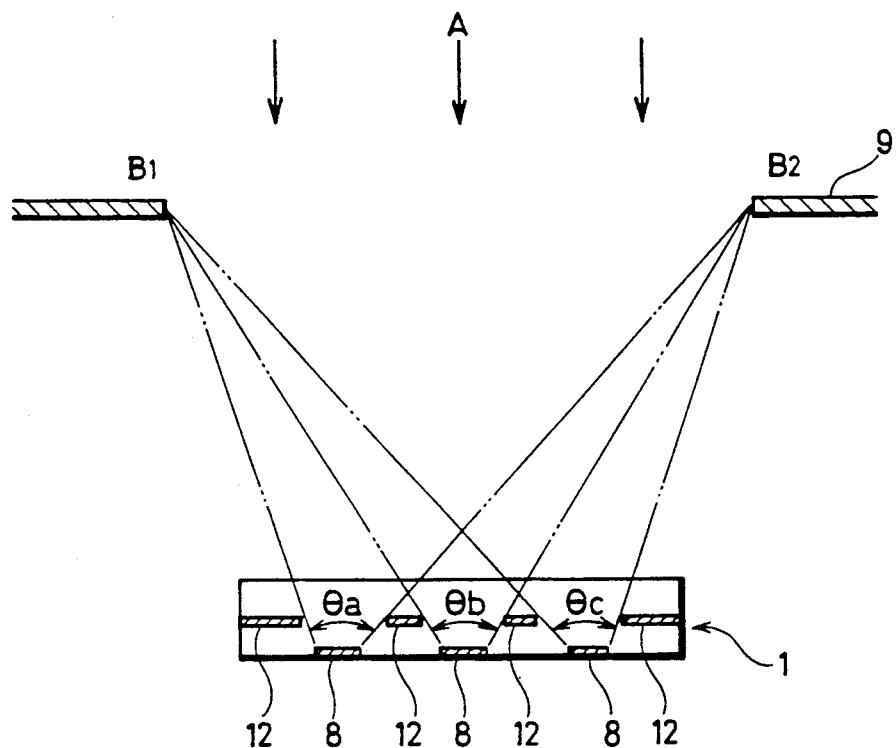
FIG. 4 is a sectional view (corresponding to the section taken along C-C or FIG. 5) showing a position relation between detecting elements, a high concentration impurity layer and apertures of an aperture stop in an infrared image sensor according to one embodiment of the present invention incorporating an image pick-up apparatus.

One embodiment of the present invention will be described with reference to the drawings in the following. FIG. 4 shows a positional relation between the detecting element 8, the high concentration impurity layer 12 and the aperture stop 9 in the image pick-up apparatus incorporating the infrared image sensor according to one embodiment of the present invention. In the infrared image sensor 1 according to the present embodiment, the Schottky type detecting element 8 is formed near one main surface (lower surface in FIG. 4) in a semiconductor substrate 1 formed of silicon.

Figure 6A:
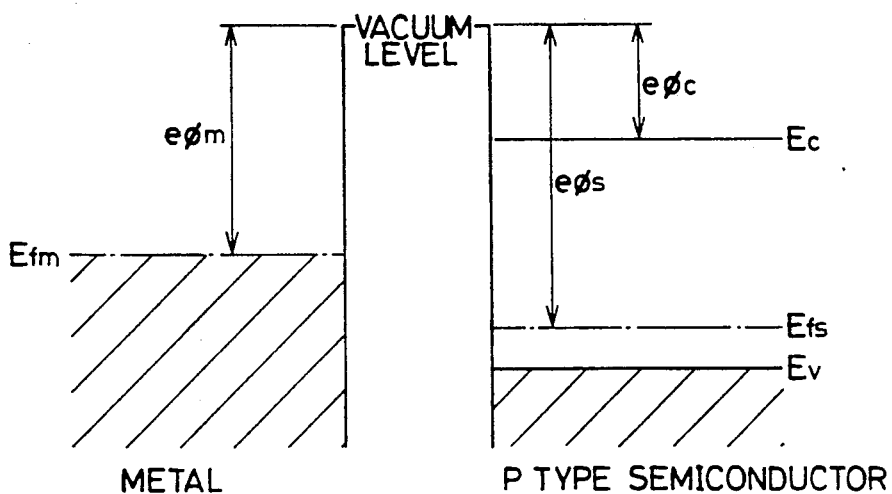
FIGS. 6A and 6B are diagrams showing states of a band of a metal-p type semiconductor junction before and after the junction, respectively, briefly explaining the basic operations of the Schottky type image sensor.
Figure 6B:
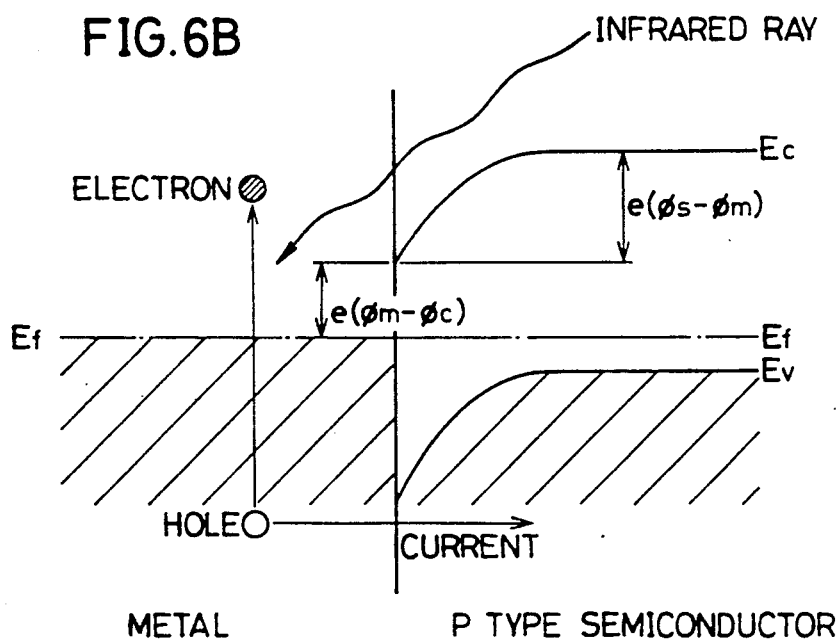

A brief description will be given of the infrared detecting operation of the Schottky type detecting element 8. The Schottky type utilizes so-called Schottky barriers which are barriers formed at a metal-semiconductor junction. A description will be given of a characteristic of the metal/semiconductor junction formed by connecting metal and a semiconductor, with reference to FIGS. 6A and 6B. FIG. 6A is a diagram showing the bands of the metal and the p type semiconductor with respect to the vacuum level. In the drawing, $\phi m$ and $\phi s$ denote work functions of the metal and the semiconductor, respectively, which express in potential a minimum energy required for extracting the electrons at a metal Fermi level Efm and at a semiconductor Fermi level Efs into the vacuum. $\phi c$ denotes a potential value expressing an energy difference between the bottom of the conductor band of the semiconductor and the vacuum level. As shown in FIG. 6, when $\phi m < \phi s$, the electrons migrate from the metal side to the semiconductor side to form a depletion layer near the interface in the semiconductor as in the case of pn junction. The depletion layer includes ionized acceptors, which are fixed charges, causing a potential gradient as shown in FIG. 6B. The metal-semiconductor interface includes barriers in the electrons in both sides of the metal and the semiconductor. These barriers are referred to as Schottky barriers (see "Electronic Device Guide" by Morisaki, published by Gijutsu Hyoronsha, pp. 38-39). In the infrared image sensor applying this Schottky barrier, electron-hole pairs are generated by the infrared rays in the metal portion, so that the generated holes are emitted into the semiconductor to become photocurrents, as shown in FIG. 6B.

The Schottky type infrared image sensor 1 allows the monolithic arrangement to be easily implemented in which the detecting elements and reading multiplexers are integrated on the same silicon substrate, which facilitates increase in the number of pixels. In addition, the silicide formed through solid phase reaction has extremely high uniformity and excellent uniformity of sensitivity which is important characteristic for a two dimensional array which has received wide interest recently. The pixel of the Schottky type infrared image sensor can be structured by replacing the detecting element portion of the image sensor for visible light by the Schottky detecting elements.

Figure 5:
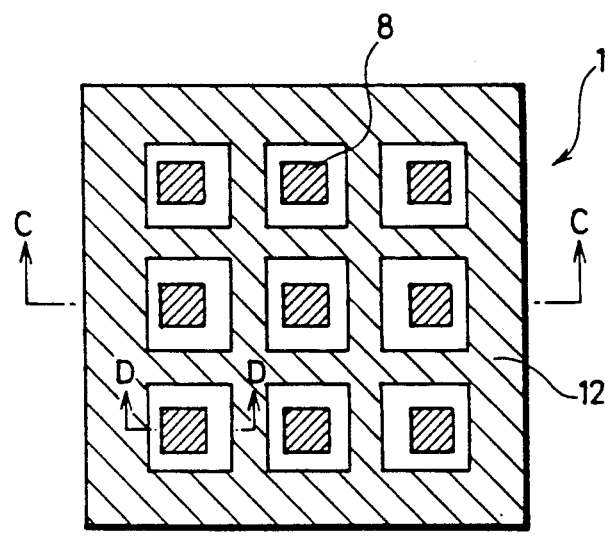
FIG. 5 is a plan view of the infrared image sensor according to the embodiment.
Figure 7A:
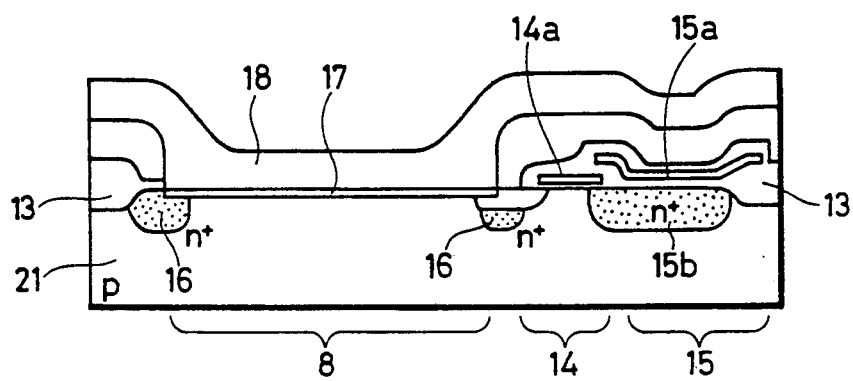
FIG. 7A is a sectional view of the vicinity of the infrared detecting element according to the embodiment shown in FIG. 4 (the view of the section taken along D-D seen upside down)
Figure 7A:
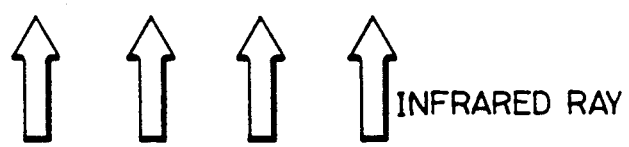
Figure 7B:
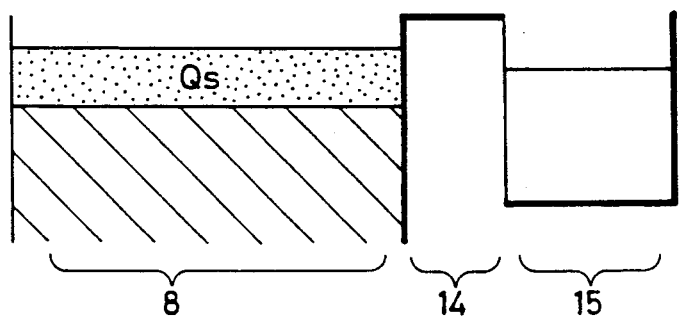
FIG. 7B is a view schematically showing how signal electrons Qs are stored through the absorption of infrared rays and FIG. 7C is a view schematically showing how the signal electrons $Q_s$ are extracted to the vertical CCD by turning on a transfer gate.
Figure 7C:
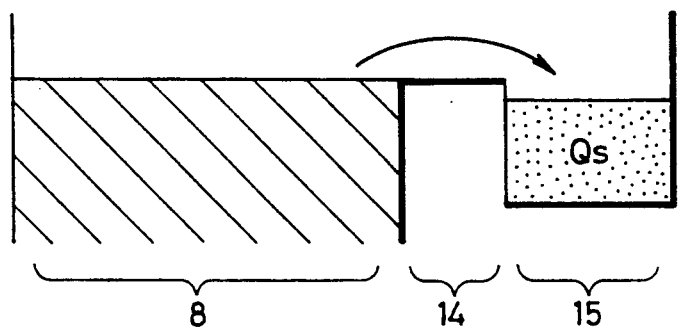

The high concentration impurity region 12 having the impurity concentration of $10^{18}$-$10^{19}$/cm$^3$ is formed in the infrared image sensor 1. The conductivity type of this high concentration impurity region 12 may be the same as or different from that of the semiconductor substrate 1a and the region is formed surrounding the respective detecting elements 8 as shown in FIG. 5. The infrared rays are illuminated from the direction indicated by the arrow A of FIG. 4. The high concentration impurity region 12 has the depth of several $\mu$m to several hundreds $\mu$m from the surface on which the detecting elements 8 are formed and the thickness tens $\mu$m and the region can be formed by using a high energy ion implanting method or an epitaxial growth method. The reading circuit comprising CCD or the like is formed between the adjacent detecting elements 8. FIG. 7 shows the sectional arrangement (corresponding to the section taken along D-D of FIG. 5) of the vicinity of the detecting element in the case where this reading circuit comprises vertical CCDs. The arrangement shown in FIG. 7 comprises a region of the detecting element 8, a region of a transfer gate 14 including a polysilicon layer 14a or the like, and a region of a vertical CCD 15 including a polysilicon layer 15a and an n type impurity region 15b in the region surrounded by an element isolating silicon oxide film 13. The surfaces of the respective regions are covered with a passivation film 18 and an n type region 16 in the periphery of the detecting element 8 serves as a guard ring for reducing dark current by attenuating the peripheral electric field. When the transfer gate is turned off, the incident infrared rays from a lower surface of a p type semiconductor 21 as indicated by the arrow are absorbed in a metal electrode portion 17 formed of a metal silicide layer including platinum silicide or iridium silicide, so that the generated holes are emitted into the semiconductor to become photocurrents, whereby signal electrons Qs are stored in the metal electrode 17 as schematically shown in FIG. 7B. By turning on the transfer gate 14 after a lapse of a predetermined storage time, the stored signal electrons Qs are read to the vertical CCD to reset the potential of the detecting element 8, as schematically shown in FIG. 7C (see "M. Kimata et al O plus E No. 115, June, 1989, pp. 100-104").

The aperture size of each high concentration impurity region 12 of the infrared image sensor 1 according to the present embodiment is settled such that the solid angle of each detecting element 8 ($\theta a, \theta b, \theta c$ shown in FIG. 4) becomes a target angle. Generally, a silicon substrate forming an infrared image sensor has an impurity concentration of $10^{14}$-$10^{15}$/cm$^3$, with such concentration the infrared rays are scarcely absorbed, while more infrared rays can be absorbed in the silicon by increasing the impurity concentration. Therefore, with the arrangement of FIG. 4, the undesired external incident light at the solid angles $\theta a$, $\theta b$, $\theta c$ is absorbed when passing through the high concentration impurity region 12, resulting in reduced undesired light reaching the detecting element 8.

The infrared ray absorption in the high concentration impurity region 12 occurs due to the transition of free electrons to different k in one band in the case of such metal and semiconductors as including a lot of free electrons. In the p type semiconductor, the absorption by free holes in a valence band occurs. This absorption is proportional to a carrier density of the semiconductor and to the square of the wavelength of the light (see "Transistor Material Engineering" p288-p291, Asakura Electrical Engineering Lecture 10, published by Asakura Bookstore).

While in the above-described embodiments, the description is made of a case where the high concentration impurity regions 12 are continuously formed, they need not always be formed continuously but may be formed scattered as long as they allow the undesired incident light on the detecting elements 8 to be cut off.

Figure 8A:
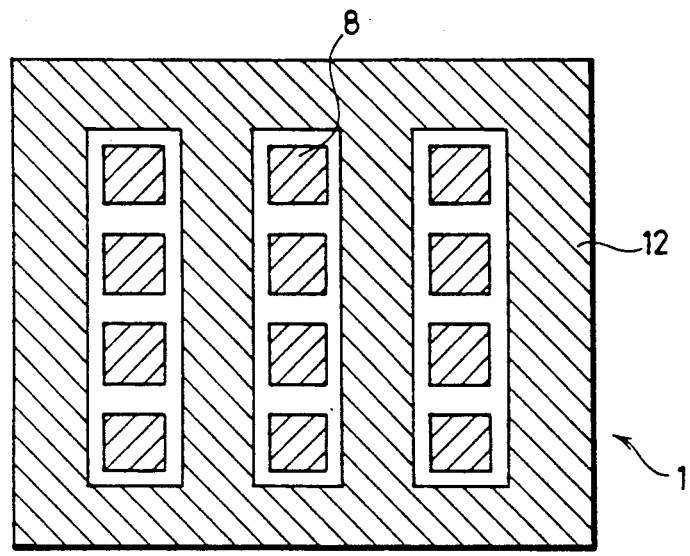
FIG. 8A is a plan view of an infrared image sensor according to another embodiment of the present invention and FIG. 8B is a plan view showing an arrangement of a detecting element of an interline transfer system to which the present embodiment is applied.
Figure 8B:
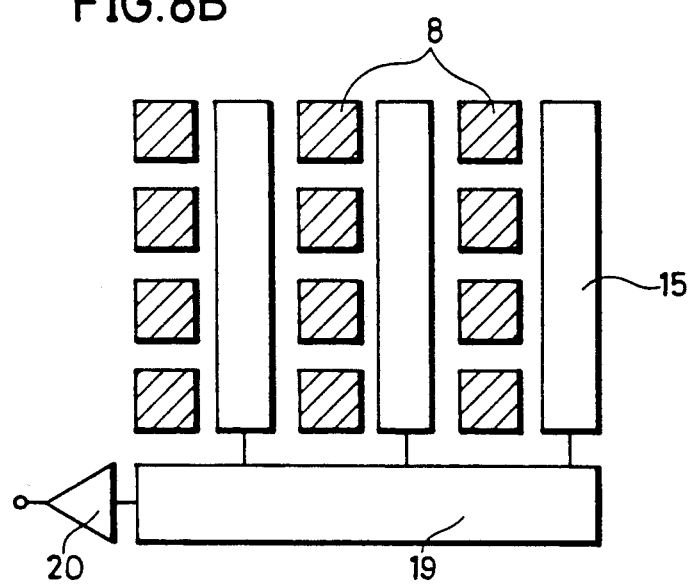

While in the above-described embodiments, the aperture of the high concentration impurity region 12 is provided for each detecting element 8, for example as shown in FIG. 8A, the aperture of the high concentration impurity layer 12 may be provided for each group of a plurality of detecting elements. The arrangement of FIG. 8B is effective in the interline transfer system having the arrays of the detecting elements 8 and vertical CCDs 15 for reading arranged alternately to which a horizontal CCD 19 and an output preamplified 20 are connected. Namely, in this system, the internal of the array direction of the detectors is small to disable the provision of the aperture of the high concentration impurity layer for each detection array. This effect of absorbing undesired light, however, can be obtained by providing an aperture for each array comprising the detecting elements 8, as shown in FIG. 8A.

Figure 1:
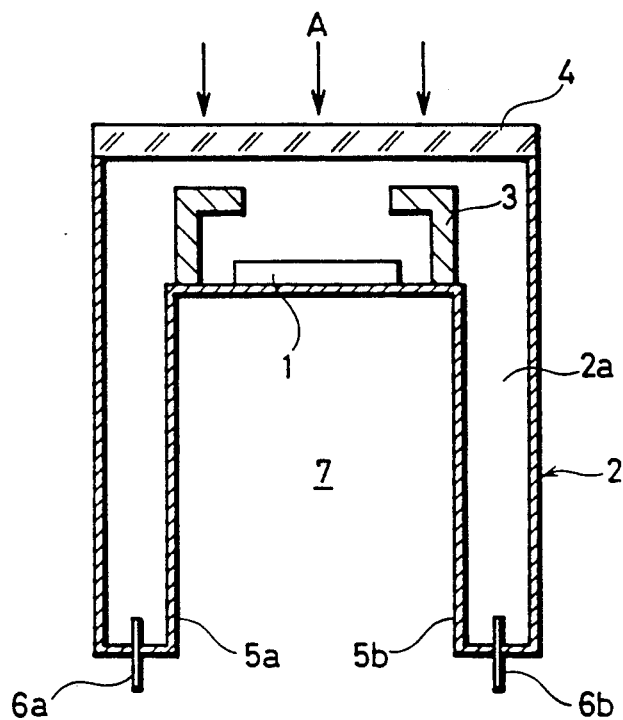
FIG. 1 is a sectional view showing a conventional infrared image sensor incorporated together with a cold shield in a dewar of an image pick-up apparatus.
Figure 2:
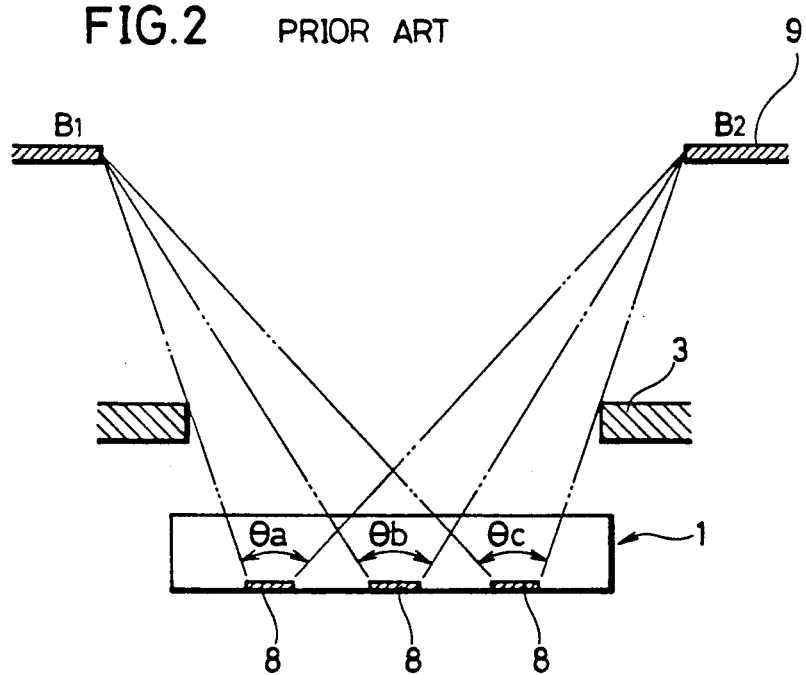
FIG. 2 is an enlarged sectional view of the vicinity of the conventional infrared image sensor.
Figure 3A:
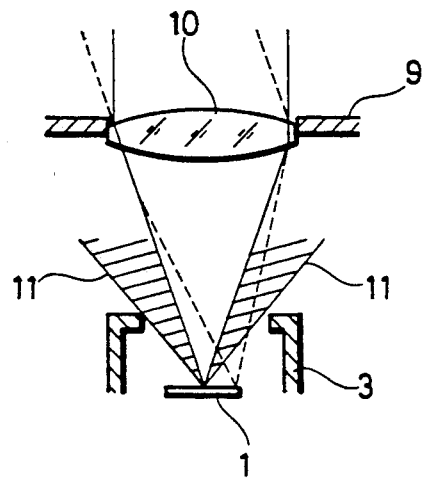
FIG. 3A is a sectional view showing an arrangement of a non-matching optical system of the conventional example and FIGS. 3B through 3D are sectional views showing arrangements of various aperture-matching optical systems.
Figure 3B:
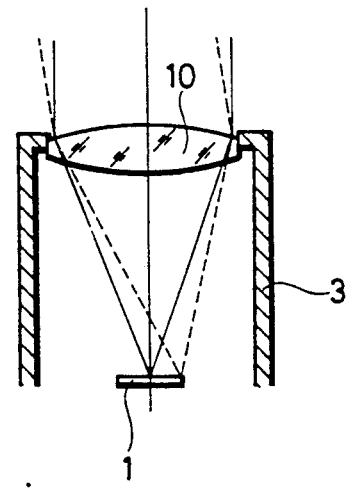
Figure 3C:
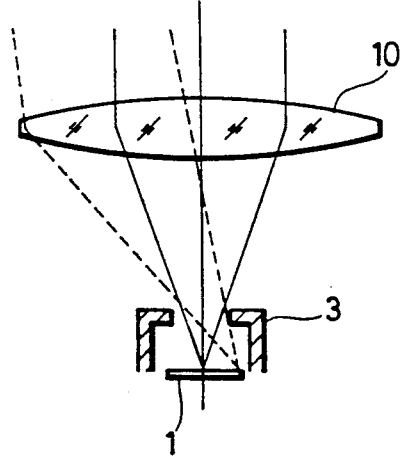
Figure 3D:
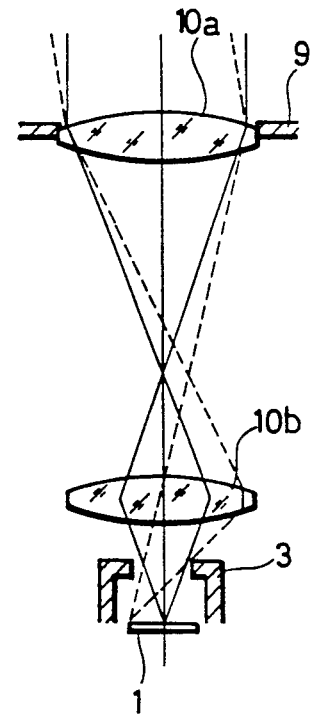
Figure 9:
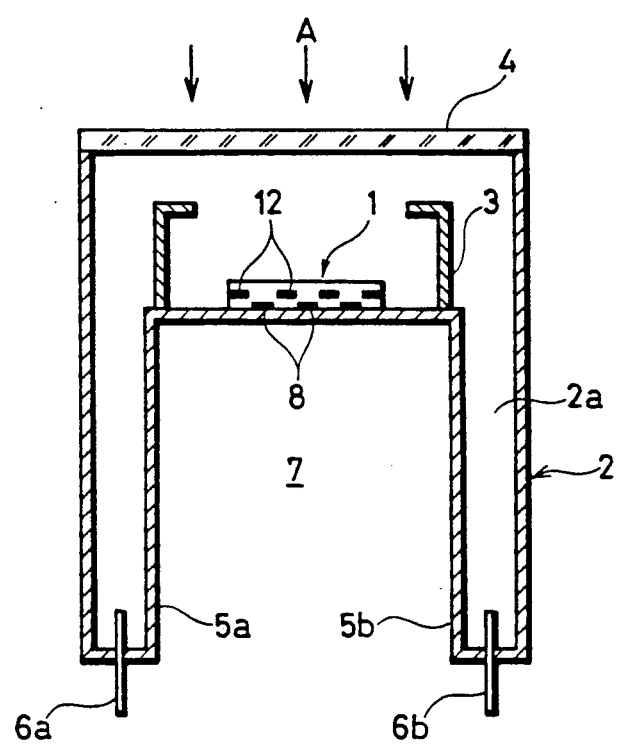
FIG. 9 is a sectional view showing the embodiment of the infrared image pick-up apparatus when the cold shield is applied to the embodiment of FIG. 4.

While the description is made in the above-described embodiments of the case where no hold shield is used, the conventional cold shield in the infrared image sensor according to the present invention produces more effect as shown in FIG. 9. The embodiment shown in FIG. 9 corresponds to the conventional example shown in FIG. 1 except that the infrared image sensor 1 of the conventional example is replaced by that of the embodiment shown in FIG. 4.

Figure 10:
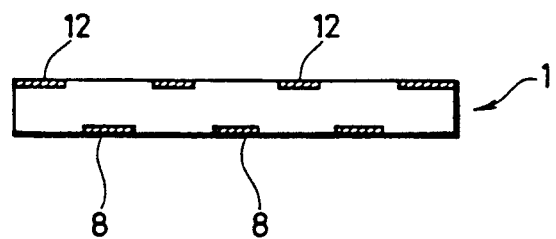

Furthermore, while in tne above-described embodiment, the high concentration impurity layer is formed in the substrate, it may be formed in the main surface as shown in FIG. 10.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An infrared image sensor comprising:
   a semiconductor substrate having a first main surface and a second main surface;
   a plurality of Schottky type infrared detecting elements arranged in an array formed in said semiconductor substrate at said first main surface to receive infrared rays radiated through said simiconductor substrate; and
   a high concentration impurity layer having infrared ray transparent apertures corresponding to predetermined groups of said infrared detecting elements, said high concentration impurity layer being arranged at a predetermined position bewteen said infrared detecting elements and said second main surface of said semiconductor substrate.

2. The infrared image sensor according to claim 1, wherein said high concentration impurity layer is formed at said second main surface of said semiconductor substrate.

3. The infrared image sensor according to claim 1, wherein said high concentration impurity layer has an impurity concentration of $10^{18}$-$10^{19}$cm$^3$.

4. The infrared image sensor according to claim 1, wherein each of said Schottky type infrared detecting elements comprises a metal electrode formed of a metal silicide layer on a p type semiconductor substrate.

5. The infrared image sensor according to claim 1, wherein each of said plurality of infrared detecting elements has a corresponding aperture in said high concentration impurity layer.

6. The infrared image sensor according to claim 1, wherein said plurality of infrared detecting elements (8) are grouped by a predetermined number of elements, each group having an aperture of said high concentration impurity layer (12).

7. The infrared image sensor according to claim 6, wherein said plurality of infrared detecting elements (8) are grouped by a predetermined number of elements, with an array of each group and a vertical CCD for reading signals being arranged alternately to which a horizontal CCD and an output preamplifier are connected, to be applied to an interline transfer system.

8. An infrared image sensor comprising:
   a semiconductor substrate having a first main surface and a second main surface;
   a plurality of Schottky type infrared detecting elements arranged in an array formed in said semiconductor substrate at said first main surface to receive infrared rays radiated through said semiconductor substrate; and
   a dewar containing said infrared image sensor in a vacuumed internal portion and having a window allowing the incident infrared rays onto the infrared image sensor,
   said infrared image sensor including a high concentration impurity layer provided with an infrared ray transparent aperture corresponding to a predetermined group of said infrared detecting elements, said high concentration impurity layer being arranged at a predetermined position between said infrared detecting elements and said second main surface of said semiconductor substrate.

9. The infrared image pick-up apparatus according to claim 8, wherein said high concentration impurity layer is formed at said second main surface of said semiconductor substrate.

10. The infrared image pick-up apparatus according to claim 8, wherein said high concentration impurity layer has an impurity concentration of $10^{18}$–$10^{19}$/cm$^3$.

11. The infrared image pick-up apparatus according to claim 8, wherein each of said Schottky type infrared detecting elements has a metal electrode formed of a metal silicide layer on a p type semiconductor substrate.

12. The infrared image pick-up apparatus according to claim 8, wherein
said plurality of infrared detecting elements are grouped by a predetermined number of elements, each group of which having an aperture in said high concentration impurity layer and each of said grouped plurality of infrared detecting elements forming an array is arranged alternately with vertical CCDs for reading signals, to which a horizontal CCD and an output preamplifier are connected, to be applied to an internline transfer system.

* * * * *